(12) United States Patent
Yamashita et al.

(10) Patent No.: US 11,337,350 B2
(45) Date of Patent: May 17, 2022

(54) CHANGEOVER OPERATION CONFIGURATION DEVICE, AND CHANGEOVER OPERATION CONFIGURATION METHOD

(71) Applicant: FUJI CORPORATION, Chiryu (JP)

(72) Inventors: Yukihiro Yamashita, Toyohashi (JP); Teruyuki Ohashi, Anjo (JP)

(73) Assignee: FUJI CORPORATION, Chiryu (JP)

( * ) Notice: Subject to any disclaimer, the term of this patent is extended or adjusted under 35 U.S.C. 154(b) by 220 days.

(21) Appl. No.: 16/609,081

(22) PCT Filed: May 10, 2017

(86) PCT No.: PCT/JP2017/017684
§ 371 (c)(1),
(2) Date: Oct. 28, 2019

(87) PCT Pub. No.: WO2018/207280
PCT Pub. Date: Nov. 15, 2018

(65) Prior Publication Data
US 2020/0154619 A1    May 14, 2020

(51) Int. Cl.
*H05K 13/04* (2006.01)
*H05K 13/08* (2006.01)
(Continued)

(52) U.S. Cl.
CPC ..... *H05K 13/0452* (2013.01); *H05K 13/0015* (2013.01); *H05K 13/02* (2013.01); *H05K 13/086* (2018.08)

(58) Field of Classification Search
CPC .............. H05K 13/0015; H05K 13/02; H05K 13/0452; H05K 13/086
See application file for complete search history.

(56) References Cited

U.S. PATENT DOCUMENTS

| 2002/0124394 A1 | 9/2002 | Slechta et al. |
| 2015/0052745 A1* | 2/2015 | Kurata ................. H05K 13/086 29/832 |
| 2016/0231727 A1 | 8/2016 | Sagara |

FOREIGN PATENT DOCUMENTS

| JP | 2004-39973 A | 2/2004 |
| JP | 2008-66405 A | 3/2008 |

(Continued)

OTHER PUBLICATIONS

International Search Report dated Jul. 25, 2017 in PCT/JP2017/017684 filed on May 10, 2017.

*Primary Examiner* — Carl J Arbes
(74) *Attorney, Agent, or Firm* — Oblon, McClelland, Maier & Neustadt, L.L.P.

(57) ABSTRACT

A changeover operation configuration device for use in a component mounting line including a registration section configured to register information of at least one of line layout information related to an arrangement of the component mounting line, work area layout information related to an arrangement of a work area at which the changeover operation is to be performed, and personnel quantity information of a quantity of operators who are to perform the changeover operation; an aggregation section configured to select the component type for which to perform changeover operation from the multiple component types, aggregate the component types to a restricted quantity of the component supply devices and designate the component supply devices as work targets; and a setting section configured to set an arrangement position of the component supply devices that are the work targets based on the at least one of the registered information.

20 Claims, 8 Drawing Sheets

(51) Int. Cl.
*H05K 13/00* (2006.01)
*H05K 13/02* (2006.01)

(56) References Cited

FOREIGN PATENT DOCUMENTS

| | | | | |
|---|---|---|---|---|
| JP | 2008066405 | A | * | 3/2008 |
| JP | 2009-272551 | A | | 11/2009 |
| JP | 2009272551 | A | * | 11/2009 |
| JP | 2012-230995 | A | * | 11/2012 |
| JP | 2013-051240 | A | * | 3/2013 |
| JP | 2014-56901 | A | | 3/2014 |
| JP | 2014056901 | A | * | 3/2014 |
| WO | 2015079497 | A1 | * | 6/2015 |
| WO | WO 2015/079497 | A1 | | 6/2015 |

\* cited by examiner

CHANGEOVER OPERATION CONFIGURATION DEVICE, AND CHANGEOVER OPERATION CONFIGURATION METHOD

TECHNICAL FIELD

The present specification relates to a device for configuring a changeover operation for switching multiple component types of electronic components to be supplied (hereinafter referred to as a component) at a component mounting line configured by arranging component mounters in a row, and a method for configuring the changeover operation.

BACKGROUND ART

Technology for mass production of circuit boards by performing various operations (hereinafter referred to as board operations) for mounting components on a board on which printed wiring has been applied have become widespread. Examples of board work machines for performing the board operations include solder printers, component mounters, reflow ovens, and board inspection machines. It is common for these board work machines to be connected to form board work lines. Further, in many cases, multiple component mounters are arranged in a row to constitute a component mounting line. Component mounters generally include: a board conveyance device; component supply devices; and a component transfer device. In many cases, component supply devices are configured from multiple feeder devices lined up in a row.

In a component mounting line, there is an upper limit to the quantity of component types of components supplied from component supply devices. Therefore, in a form of multi-product production in which the board type to be produced is switched, changeover operation for switching multiple component types of the supplied components is required. Changeover operation includes: internal changeover operation in which a feeder device or the like is changed in a component supply device attached to a component mounter; and external changeover operation in which a component supply device is prepared in advance in an external changeover area and then attached to a component mounter. Patent literature 1 discloses an example of technology related to changeover operations of a component mounting line.

According to the component mounting method of the component mounting line disclosed in patent literature 1, multiple board types produced in accordance with a production order are alternately distributed to component supply devices on one side and the other side of the component mounting line, and whenever the board types are switched, the positions of supply operators and preparation operators are switched between the one side and the other side of the component mounting line. Supply operators replenish components consumed for the board type currently being produced, and preparation operators perform changeover operation of preparing the required components for the board type to be produced next.

According to this, movement paths of supply workers and movement paths of preparation workers do not overlap with each other, and work efficiency is improved.

CITATION LIST

Patent Literature

Patent literature 1: JP-A-2012-230995

BRIEF SUMMARY

Technical Problem

Various optimization techniques have been put into practical use with respect to problems such as how multiple feeder devices are to be distributed to component supply devices during changeover operation, and the arrangement order of the feeder devices. For example, optimization techniques have been developed that maximize the installation efficiency for a specified board type, and optimization techniques have been developed for successively producing multiple board types.

However, conventional optimization techniques aim to improve the efficiency of mounting operations by considering the line configuration of the component mounting line and the types of components to be mounted, they have not taken into consideration the workability of changeover operation. Therefore, even if mounting operation is made efficient by the optimization, changeover operation is not necessarily made efficient. For example, depending on the arrangement position of the component supply device that is an operation target, the movement path that the worker moves along when performing changeover work becomes long, lowering work efficiency.

Further, in patent literature 1, since one worker each moves on both sides of a single component mounting line, the movement paths of the two workers do not overlap. However, if multiple component mounting lines are arranged close to each other, there is a fear that interference will occur when multiple operators perform changeover operations. In addition, when external changeover operation is performed, there are cases in which a component supply device must be moved to an arrangement position far from the external changeover area, which is inefficient.

Such problems related to the efficiency of changeover operation are not solved by conventional optimization techniques. These problems become particularly applicable in a production type of high-mix low-volume production in which the frequency of changeover operation is high. To solve these problems, it is necessary to consider the arrangement of the component mounting line and the work area, the quantity of operators, and the like.

An object of the present disclosure is to provide a changeover operation configuration device, and a changeover operation configuration method that improve the efficiency of changeover operation for switching multiple component types in a component mounting line.

Solution to Problem

Disclosed herein is a changeover operation configuration device for use in a component mounting line configured from multiple component mounters lined up in a row, the component mounters each having a component supply device configured to supply multiple component types of electronic components and being configured to mount the electronic components on a board, the changeover operation configuration device being configured to set in advance changeover work of switching the multiple component types when a board type of the board is switched, the changeover operation configuration device including: a registration section configured to register information of at least one of line layout information related to an arrangement of the component mounting line, work area layout information related to an arrangement of a work area at which the changeover operation is to be performed, and personnel quantity information of a quantity of operators who are to perform the changeover operation; an aggregation section configured to select the component type for which to perform changeover operation from the multiple component types, aggregate the component types to a restricted quantity of the component supply devices and designate the component supply devices as work targets; and a setting section configured to set an arrangement position of the component supply devices that are the work targets based on the at least one of the registered information.

Also disclosed herein is a changeover operation configuration method for use in a component mounting line configured from multiple component mounters lined up in a row, the component mounters each having a component supply device configured to supply multiple component types of electronic components and being configured to mount the electronic components on a board, the changeover operation configuration method being configured to set in advance changeover work of switching the multiple component types when a board type of the board is switched, the changeover operation configuration method including: registering information of at least one of line layout information related to an arrangement of the component mounting line, work area layout information related to an arrangement of a work area at which the changeover operation is to be performed, and personnel quantity information of a quantity of operators who are to perform the changeover operation; selecting the component type for which to perform changeover operation from the multiple component types, aggregating the component types to a restricted quantity of the component supply devices, and designating the component supply devices as work targets; and setting an arrangement position of the component supply devices that are the work targets based on the at least one of the registered information.

Advantageous Effects

With the changeover operation configuration device and method of the present disclosure, when the type of board is switched, information is registered of at least one of line layout information, work area layout information, and personnel quantity information. Further, the component types required for changeover operation are selected, the component types are aggregated to a restricted quantity of component supply devices, and the component supply devices are designated as work targets. This makes it possible to limit the quantity of component supply devices that are made work targets without necessarily restraining the mounting work from being efficient. Further, based on the registered information, the arrangement positions of the component supply devices that are work targets are appropriately set such that the changeover operation can be efficiently performed. For example, it is possible to perform setting that shortens a movement path along which an operator who performs changeover operation moves, or that curtails interference between multiple operators. Accordingly, it is possible to limit the quantity of component supply devices made to be work targets, and further to optimize the arrangement positions of the component supply devices, thereby making the changeover operation more efficient.

DESCRIPTION OF EMBODIMENTS

1. Configuration of Component Mounting Line 6

Figure 1:
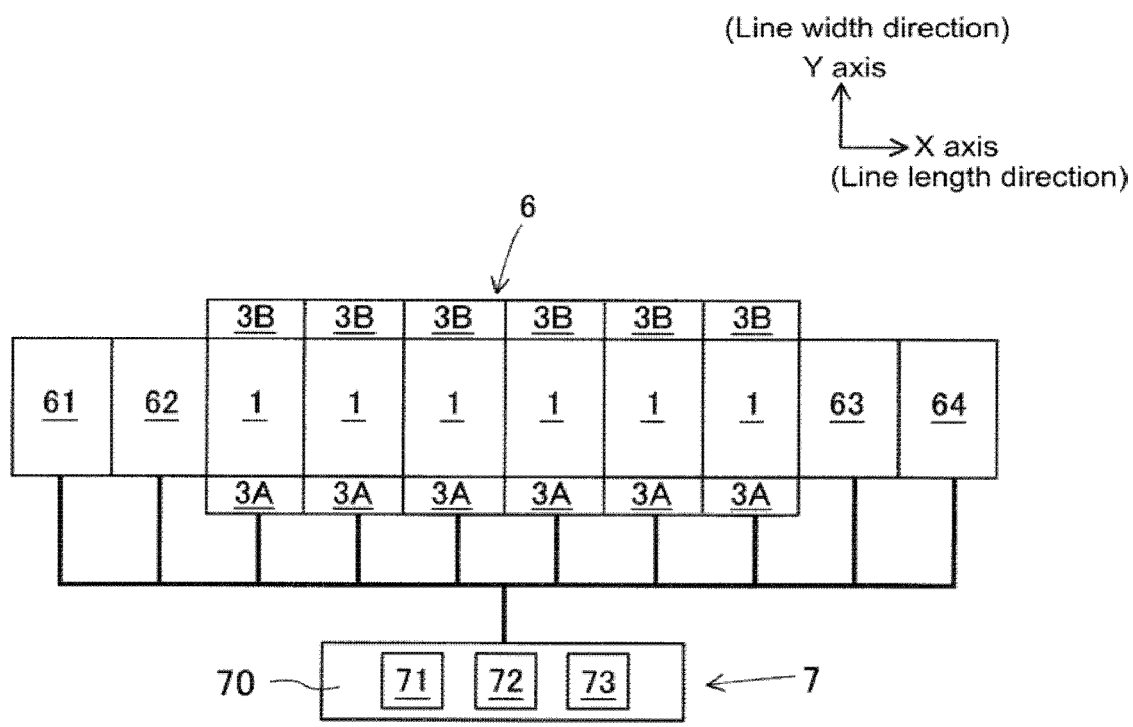
FIG. 1 is a plan view schematically showing the configuration of a component mounting line.

Changeover operation configuration device 7 of a first embodiment will be described with reference to FIGS. 1 to 5. First, the configuration of component mounting line 6 which is the target for changeover operation configuration device 7 will be described. FIG. 1 is a plan view schematically showing the configuration of component mounting line 6. The X-axis direction that extends left-right in FIG. 1 is the conveyance direction of a board that is conveyed, and is a line length direction. The Y-axis direction that extends up-down in FIG. 1 is a line width direction. Component mounting line 6 is formed by arranging six component mounters 1 in a row. Solder printer 61 and printing inspection machine 62 are arranged in a row on the upstream side of component mounting line 6. Board appearance inspection machine 63 and reflow oven 64 are arranged on the downstream side of component mounting line 6. This constitutes a board work line consisting of ten board work machines.

Figure 2:
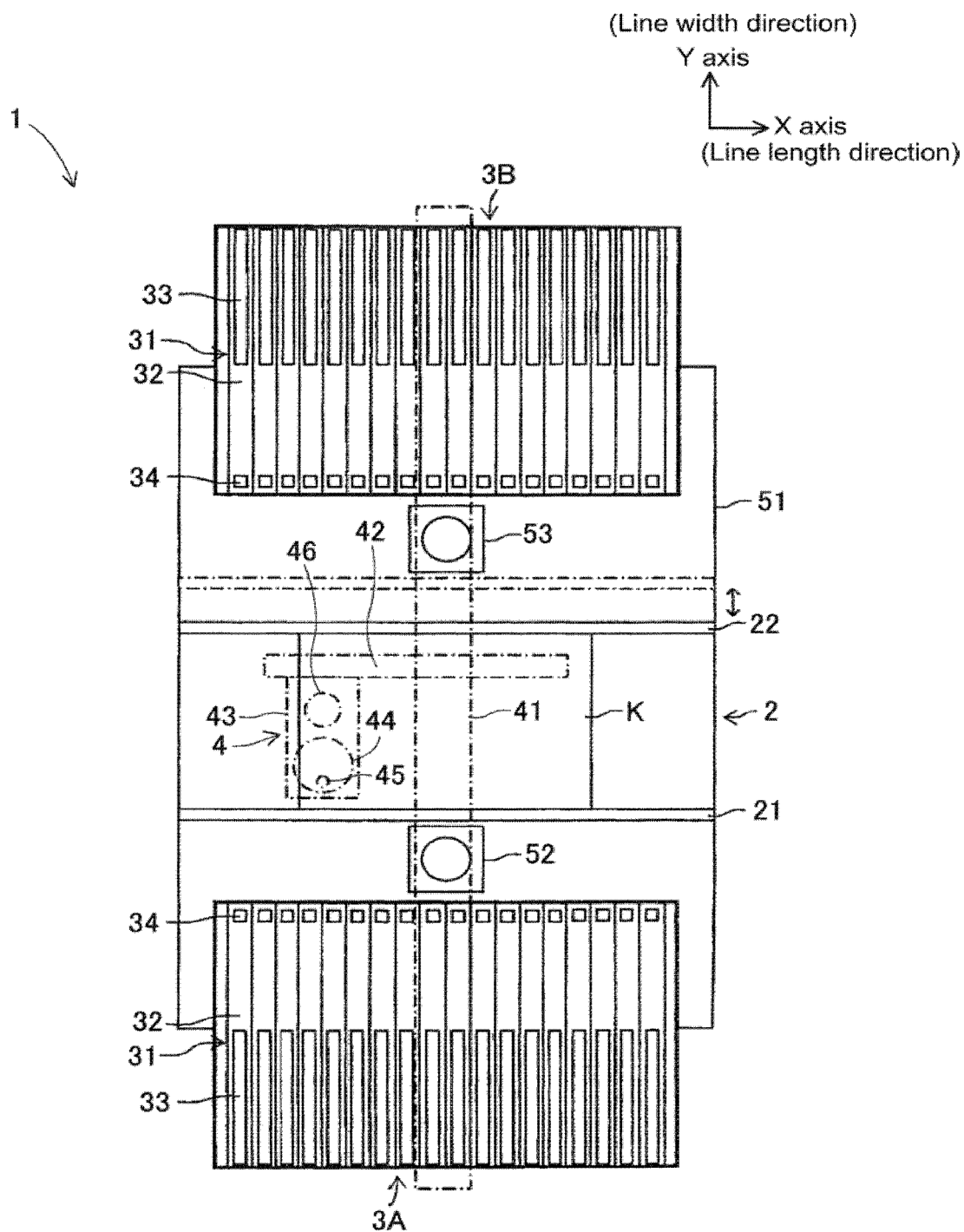
FIG. 2 is a plan view showing the configuration of a component mounter that constitutes a component mounting line.

The six component mounters 1 have the same construction, but are not limited to this. FIG. 2 is a plan view showing the configuration of a component mounter 1 that constitutes component mounting line 6. Component mounter 1 is configured by arranging board conveyance device 2, two component supply devices (3A and 3B), and component transfer device 4 on base 51.

Board conveyance device 2 includes first guide rail 21 and second guide rail 22, a pair of conveyor belts, a clamp device, and the like. First guide rail 21 and second guide rail 22 are mounted on base 51 parallel to each other so as to extend in the X-direction across the upper center of base 51. Second guide rail 22 is movable so that the separation distance can be adjusted according to the width of board K. A pair of conveyor belts arranged in parallel to each other are arranged on opposite inner sides of first guide rail 21 and second guide rail 22. Rotation of the pair of conveyor belts conveys the board K loaded on the belts. A clamp device for pushing up the board K and clamping it at a mounting position is arranged below the conveyor belt of the central portion of base 51.

First component supply device 3A is provided on one side (lower side in FIG. 1) of component mounter 1. Second component supply device 3B is provided on the other side (upper side in FIG. 1) of component mounter 1. First component supply device 3A is configured by arranging multiple feeder devices 31 which can be exchanged and the arrangement position of which can be changed. In the example of FIG. 2, there are eighteen feeder devices 31 lined up. Feeder device 31 includes: main body 32; supply reel 33 provided at the rear of main body 32; and component removal section 34 provided at the front end of main body 32. Carrier tape (not shown) in which multiple components are enclosed at a predetermined pitch is wound and held on supply reel 33. The carrier tape is pulled out at predetermined pitch, and the components are released from the enclosed state and sequentially fed to component removal section 34.

Similarly, second component supply device 3B is configured by arranging eighteen detachable feeder devices 31 in a row. First component supply device 3A and second component supply device 3B are detachably mounted on machine base 51. Further, first component supply device 3A and second component supply device 3B are interchangeable so that they can be installed anywhere on one side and the other side of the six component mounters 1. First component supply device 3A and second component supply device 3B are not limited to the feeder type device described above, and may be a tray type device for supplying components side by side on a tray, or a feeder-tray combination type device using both types.

Component transfer device 4 includes fixed rail 41, moving body 42, mounting head 44, suction nozzle 45, and board recognizing camera 46. Fixed rail 41 is arranged above board conveyance device 2 and extends in Y-axis direction. Moving body 42 is movably loaded on the underside of fixed rail 41 and moves in the X axis and Y axis directions. Moving body 42 is detachably provided with support base 43. Mounting head 44 and board recognizing camera 46 are provided on support base 43.

Mounting head 44 has suction nozzle 45 on its lower side. There are different types of mounting head 44, such as a single nozzle head with one suction nozzle 45, and a multi-nozzle head that holds multiple suction nozzles 45 in a rotatable manner. Suction nozzle 45 picks up a component from feeder device 31 and attaches it to board K. Board recognition camera 46 reads fiducial marks of the positioned board K and recognizes the error of the mounting position of the board K. This error is reflected in position control when suction nozzle 45 mounts the component.

Component mounter 1 further includes first component recognizing camera 52 on base 51 between board conveyance device 2 and first component supply device 3A. Further, component mounter 1 has second component recognizing camera 53 on base 51 between board conveyance device 2 and second component supply device 3B. First component recognition camera 52 and second component recognition camera 53 image components picked up by suction nozzles 45, and detect a deviation of the pickup position and the rotational angle of the components, bending of leads, and the like.

Returning to FIG. 1, host computer 70 is provided to manage the operation status of the board work line including component mounting line 6. Host computer 70 is communicatively connected to the board work machines (six component mounters 1, solder printer 61, printing inspection machine 62, board appearance inspection machine 63, and reflow oven 64). Host computer 70 holds job data for each board type of board K, and also has a job data editing function. Job data is data describing detailed methods and procedures of the board work performed by each board work machine. Host computer 70 transmits job data and various commands to each of the board work machines, and receives information on the operation status and the like from the board work machines.

2. Changeover Operation Configuration Device 7 of the First Embodiment

Turning to descriptions of changeover operation configuration device 7 of the first embodiment. Configuration device 7, when a board type of board K is switched at component mounting line 6 configured from multiple component mounters 1 lined up in a row, sets in advance changeover operation for switching multiple component types. Configuration device 7 operates when changeover operation is required. Configuration device 7 includes registration section 71, aggregation section 72, and setting section 73, which are realized by software functions of host computer 70. Functions of registration section 71, aggregation section 72, and setting section 73 will be described in detail later along with operation descriptions.

Here, when the component supply devices (3A and 3B) are feeder type devices, the largest number of component types, Nmax, that can be mounted on the component mounting line 6 is obtained by the following equation.

$$N\text{max} = F \times D \times M$$

Where F=feeder quantity of component supply devices
D=quantity of component supply devices that can be equipped on one component mounter
M=quantity of component mounters In a case of the configuration above, the maximum component type quantity is Nmax=18×2×6=216 (component types).

Further, assume that the quantity of component types mounted only on a first board type is N1, the quantity of component types mounted only on a second board type is N2, and the quantity of component types mounted on both the first board type and the second board type is N3. Here, the total quantity of component types to be mounted, Nsum, is obtained by the following equation.

$$N\text{sum} = N1 + N2 - N3$$

If the total quantity of component types Nsum is equal to or less than the maximum component type quantity Nmax, no changeover operation is required when switching from the first board type to the second board type. On the other hand, if the total quantity of component types Nsum exceeds the maximum component type quantity Nmax, changeover operation is required. Note that, when switching from a first board group including multiple board types that can be handled without performing changeover operation to a second board group, changeover operation may be performed.

Changeover operation includes internal changeover operation and external changeover operation. Internal changeover operation is performed directly on a component supply device (3A or 3B) installed on component mounter 1, and entails replacing feeder device 31 or supply reel 33. On the other hand, external changeover operation is performed in an external changeover work area away from component mounting line 6. In external changeover operation, changeover is performed by exchanging feeder device 31 or supply reel 33 on component supply devices (3A or 3B) in advance. Subsequently, component supply devices (3A and 3B) for which changeover is complete are attached to component mounter 1.

Figure 3:
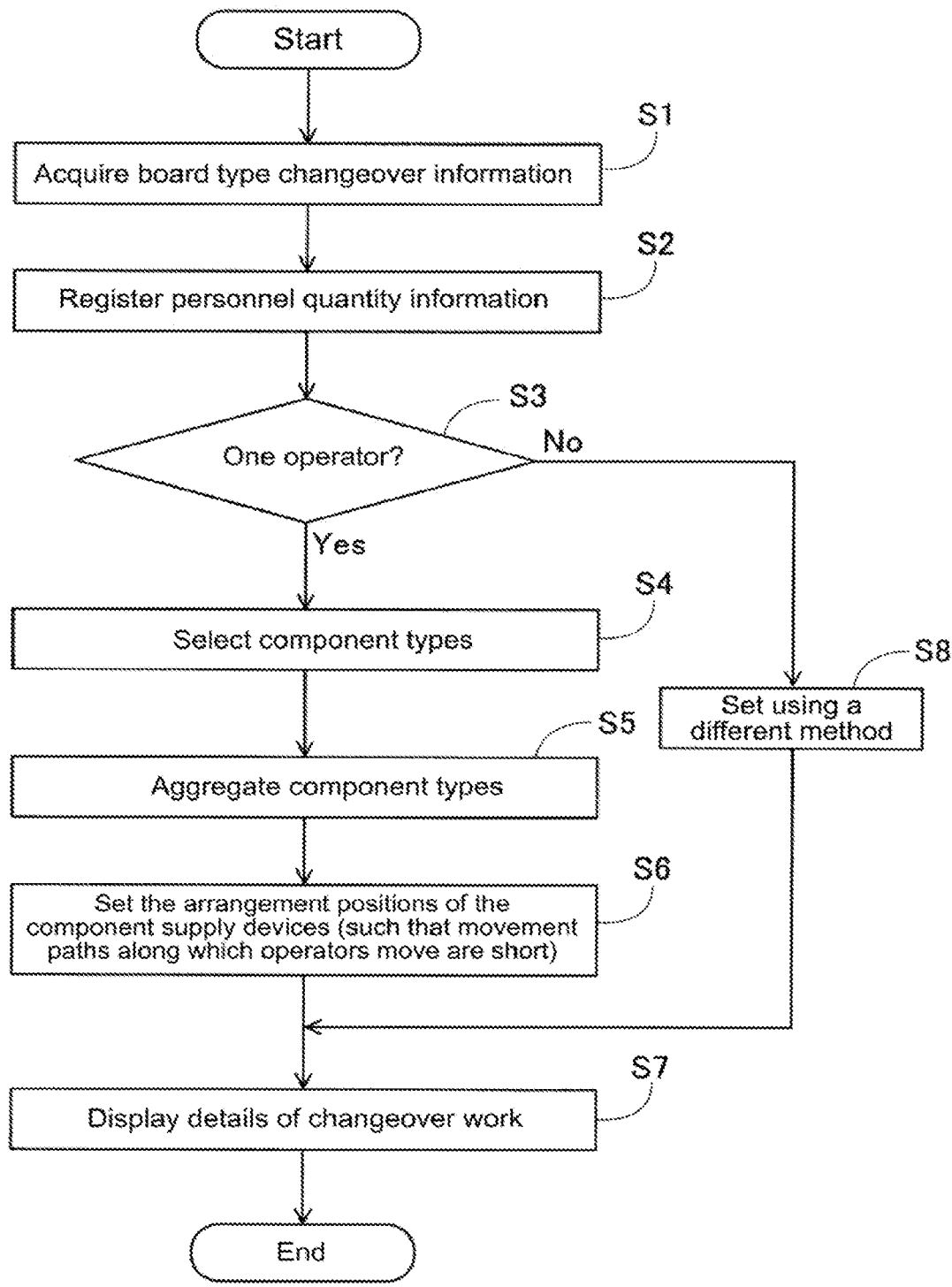
FIG. 3 is a flowchart showing the operation flow of a configuration device.

FIG. 3 is a flowchart showing the operation flow of configuration device 7. In S1 of FIG. 1, configuration device 7 acquires information of the board types of board K to be switched. For the case above, configuration device 7 sets the changeover information from the first board type to the second board type. Configuration device 7 operates in advance before starting changeover operation with respect to the first board type. In S2, registration section 71 of configuration device 7 registers personnel quantity information of operators who will perform the changeover operations. The personnel quantity information is determined by manual setting by an input operation of an operator, automatic setting by data transfer from a personnel planning database, or the like.

In S3, configuration device 7 decides which processing of the flowchart to perform based on the personnel quantity information. When the personnel quantity information indicates one operator, in S4, aggregation section 72 of configuration device 7 selects the component types for which to perform changeover operation. Specifically, aggregation section 72 distinguishes a first component group of components only to be mounted on a first board type, a second component group of components only to be mounted on a second board type, and a third component group of components to be mounted on both the first board type and the second board type. Changeover operation is not required for the third component group. On the other hand, changeover operation is required for at least a portion of the first component group and the second component group. The quantity of component types for which changeover operation is performed varies depending on the combination of board types before and after the changeover operation and the combination of board groups before and after the changeover operation.

In S5, aggregation section 72 aggregates the component types for which changeover operation is to be performed into a restricted quantity of component supply devices (3A and 3B) and sets the component supply devices as work targets. Here, aggregation section 72 limits as far as possible the quantity of component supply devices (3A and 3B) to be made work targets so as to reduce the workload of changeover operation. At this point, the quantity of component supply devices (3A and 3B) to be made work targets is decided, but the arrangement positions are not decided. A portion of the functions of aggregation section 72 may be performed according to settings made by an operator.

Note that, conventional optimization processing for making mounting work efficient is not performed. If conventional optimization processing is performed, component types with a high frequency of use are preferentially allocated to feeder devices 31 near the center of the component supply device (3A or 3B), which is efficient for operation. Thus, changeover operation needs to be performed at many component supply devices (3A and 3B) and the quantity cannot be limited.

In S6, setting section 73 of configuration device 7 sets the arrangement positions of the component supply devices (3A and 3B) that are work targets such that movement paths along which operators who perform changeover operation are made short. The changeover operation to be performed may be internal changeover operation or external changeover operation. In S7, configuration device 7 displays details of the changeover operation including the arrangement positions of the component supply devices (3A and 3B) that are work targets. Operators perform the changeover operation according to the display.

Figure 4:
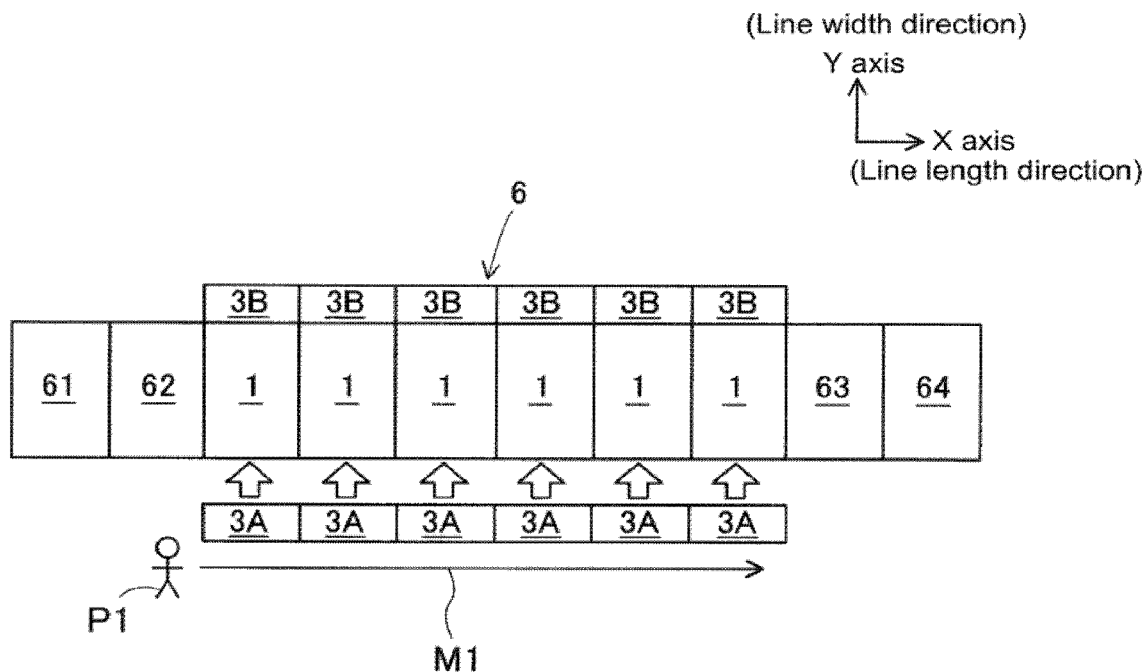
FIG. 4 shows a first example of arrangement positions of component supply devices that are work targets.

FIG. 4 shows a first example of arrangement positions of component supply devices that are work targets. As shown in the figure, setting section 73 sets first component supply devices 3A of one side of the six component mounters 1 as work targets. Instead of all six component mounters 1, first component supply devices 3A of five or fewer component mounters 1 may be set as work targets. Thus, movement path M1 along which operator P1 moves is short because the work area is entirely on one side of component mounting line 6. Therefore, the work efficiency of changeover operation is improved.

Figure 5:
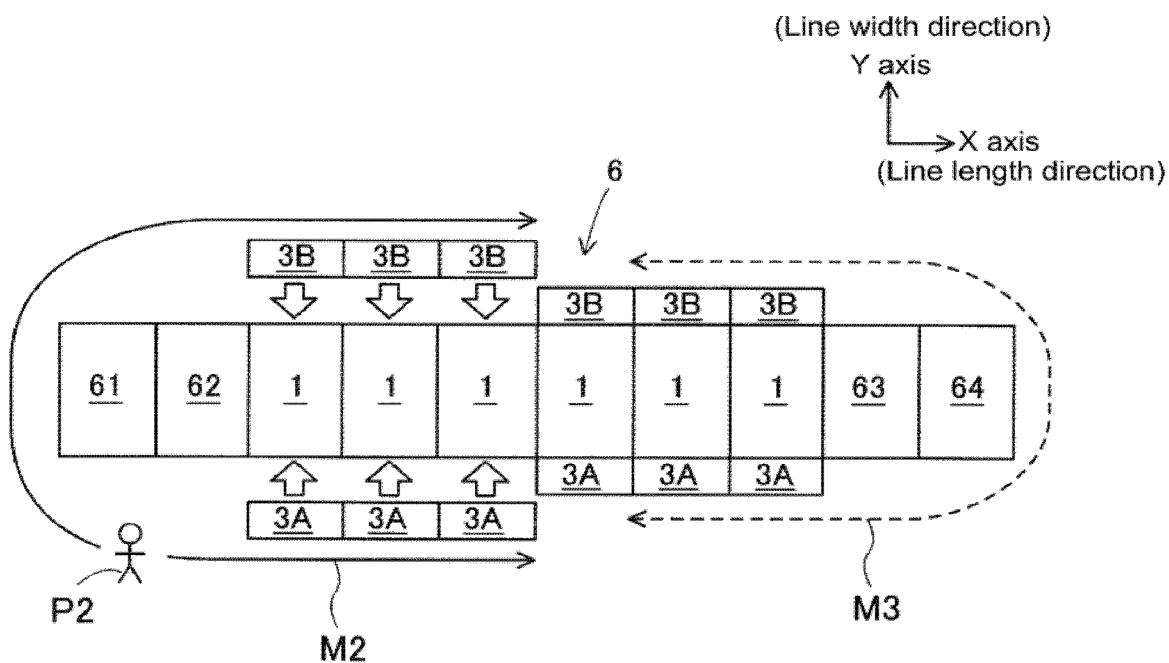
FIG. 5 shows a second example of arrangement positions of component supply devices that are work targets.

FIG. 5 shows a second example of arrangement positions of component supply devices that are work targets. As shown in the figure, setting section 73 sets first component supply devices 3A on one side of three component mounters 1 on the upstream side and second component supply devices 3B on the other side of the three component mounters 1 on the upstream side as work targets. As a result, movement path M2 along which operator P2 moves is short because the work area is concentrated at the upstream side of component mounting line 6. Therefore, the work efficiency of changeover operation is improved. Alternatively, first component supply devices 3A and second component supply devices 3B of two component mounters 1 on the downstream side may be set as work targets. Here, movement path M3, which is indicated by a broken line, along which worker P2 moves, is concentrated in a work area on the downstream side of component mounting line 6, so the work efficiency is similarly improved.

Note that, when personnel quantity information indicates multiple operators in S8, configuration device 7 sets the arrangement positions of the component supply devices (3A or 3B) that are work targets by another method without limiting the arrangement positions. Configuration device 7 may alternatively perform conventional optimization processing, but is not limited thereto. If there are multiple operators, changeover operations can be divided between the operators even if component supply devices (3A and 3B) that are work targets are set in a wide range from the upstream side to the downstream side on both sides of component mounting line 6. Therefore, the work efficiency of changeover operation is not lowered much.

In the first embodiment, since the quantity of component supply devices (3A and 3B) that are work targets is limited and the lengths of the movement paths (M1, M2 and M3) along which operators (P1 and P2) move are shortened by optimizing the arrangement positions, changeover operation is made efficient. This effect is particular pronounced in a production type of high-mix low-volume production. More specifically, in a production type of low-mix high-volume production, since occurrences of changeover operation are few, it is advantageous to improve the efficiency of the mounting work even if this results in changeover operation taking more time. In contrast, in a production type of high-mix low-volume production, since occurrences of changeover operation are many, it is important to reduce the changeover operation without being restricted by the need to improve the efficiency of mounting work. As a result, the overall work efficiency including both the mounting work of component mounting line 6 and the changeover operation of operators (P1 and P2) is enhanced.

3. Changeover Operation Configuration Device 7C of a Second Embodiment

Figure 6:
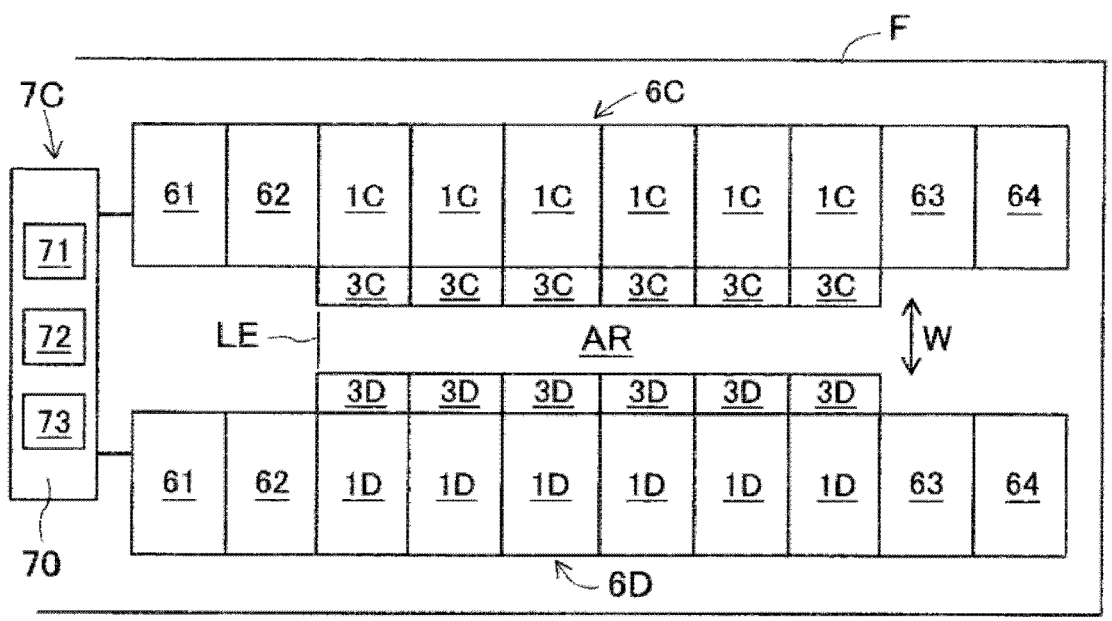
FIG. 6 is a plan view schematically showing the configuration of two component mounting lines of a second embodiment.

Changeover operation configuration device 7C of a second embodiment will be described with reference to FIGS. 6 to 9, with points that are different from the first embodiment mainly being described. With the second embodiment, first component mounting line 6C and second component mounting line 6D are arranged in parallel on floor F. FIG. 6 is a plan view schematically showing the configuration of two component mounting lines (6C, 6D) of a second embodiment.

As shown in the figure, first component mounting line 6C is formed by arranging six first component mounters 1C in a row. Similarly, second component mounting line 6D is also configured by arranging six second component mounters 1D in a row. The line configurations on the upstream side and the downstream side of first component mounting line 6C and second component mounting line 6D are the same as those of the first embodiment. In FIG. 6, the line end LE shared by first component mounting line 6C and second component mounting line 6D is defined as the upstream side of the line.

First component mounters 1C have component supply devices 3C on a side facing second component mounters 1D. Similarly, second component mounters 1D have component supply devices 3D on the side facing first component mounters 1C. Component supply devices 3C and component supply devices 3D are compatible with any first component mounter 1C or second component mounter 1D. Work area AR is demarcated between first component mounting line 1C and second component mounting line 1D. Width dimension W of work area AR is determined by the distance between first component mounting line 1C and second component mounting line 1D. Due to restrictions of the layout of floor F, width dimension W of work area AR is not sufficiently secured. In other words, width dimension W of work area AR is small, and multiple operators may interfere with each other.

Figure 7:
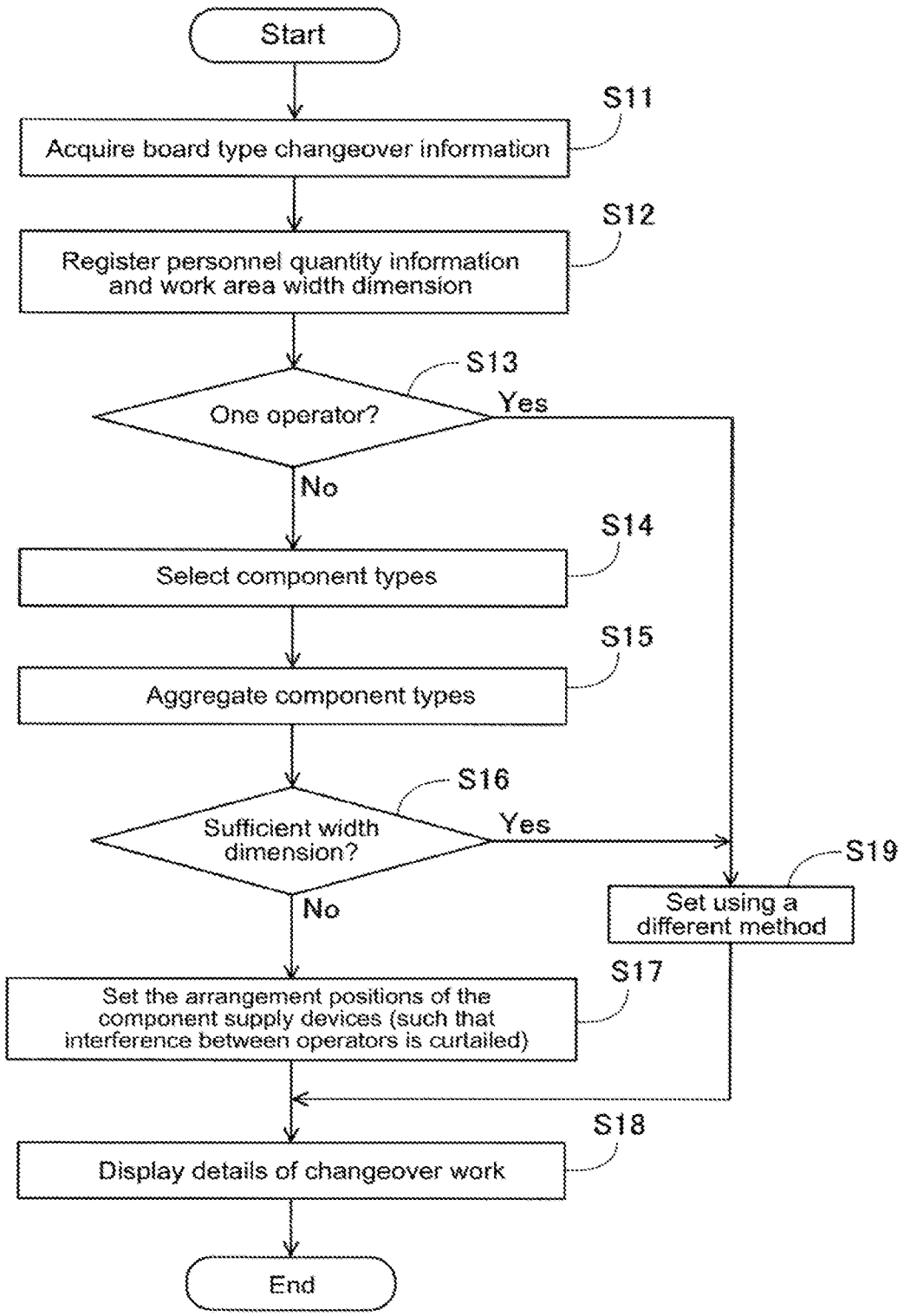
FIG. 7 is a flowchart showing the operation flow of a configuration device of the second embodiment.

Configuration device 7C is provided with host computer 70, registration section 71, aggregation section 72, and setting section 73 shared by both component mounting lines (6C and 6D), but the functionality is different to that of the first embodiment. Configuration device 7C of the second embodiment operates when changeover operation of first component mounting line 6C and changeover operation of second component mounting line 6D are performed in parallel. FIG. 7 is a flowchart showing the operation flow of configuration device 7C of the second embodiment.

In S11 of FIG. 7, configuration device 7C acquires information for switching the board type of the board K for the two component mounting lines (6C and 6D). In S12, registration section 71 of configuration device 7C registers the personnel quantity information of the quantity of operators performing changeover operation and width dimension W of work area AR. The personnel quantity information changes in a case in which this indicates that one operator is in charge of two component lines (6C and 6D) or in case in which there are separate operators for each line. Width dimension W of work area AR is the work area layout information and does not need to be re-registered if it has been registered in the past.

In S13, configuration device 7C decides which processing of the flowchart to perform based on the personnel quantity information. When the personnel quantity information indicates multiple operators in S14, aggregation section 72 of configuration device 7C selects the types of components for which changeover operation is to be performed for the two component mounting lines 6C and 6D, respectively. In S15, for the two component mounting lines (6C and 6D), aggregation section 72 aggregates the component types for which changeover operation is to be performed to a restricted quantity of component supply devices (3C, 3D) and sets them as work targets. Here, aggregation section 72 limits the quantity of component supply devices (3C, 3D) that are work targets to be as small as possible, thereby reducing the labor required for changeover operation.

In S16, configuration device 7C decides which processing of the flowchart to perform width dimension W of operation area AR. As described above, since width dimension W is insufficient, configuration device 7C proceeds to S17 of the flowchart. In S17, setting section 73 of configuration device 7 sets the arrangement positions of component supply devices that are work targets so as to curtail interference between the multiple workers during changeover operation. Specifically, setting section 73 sets component supply devices (3C, 3D) of only one of first component mounters 1C or second component mounters 1D that face each other as work targets. The changeover operation to be performed may be internal changeover operation or external changeover operation. Further, in S18, configuration device 7C displays details of the changeover operation including the arrangement positions of the component supply devices (3C, 3D) that are work targets. Operators perform the changeover operation according to the display.

Figure 8:
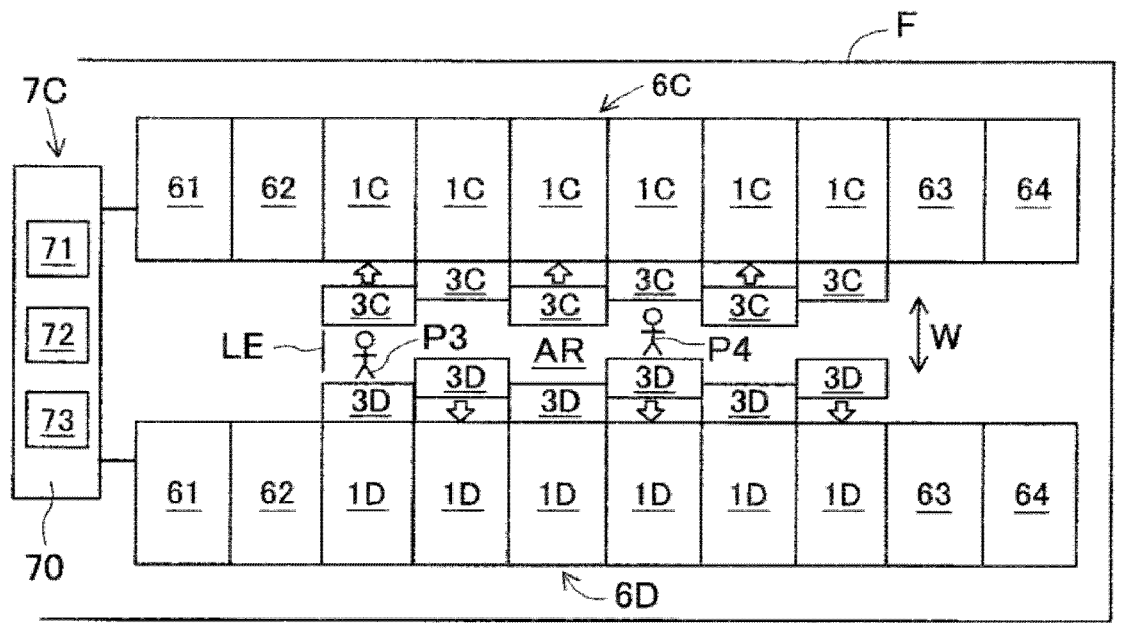
FIG. 8 shows a third example of arrangement positions of component supply devices that are work targets in the second embodiment.

FIG. 8 shows a third example of arrangement positions of component supply devices that are work targets in the second embodiment. As shown in the figure, setting section 73 sets as work targets only component supply devices 3C of three first component mounters 1C, that is, the first, third, and fifth first component mounters 1C, and component supply devices 3D of three second component mounters 1D, that is, the second, fourth, and sixth second component mounters 1D. As a result, changeover operation is not performed at the two component mounting lines (6C and 6D) in parallel at the same location, and interference between multiple operators (P3, P4) is curtailed. Therefore, the work efficiency of changeover operation is improved.

Note that, component supply devices (3C, 3D) of five or fewer component mounters (1C, 1D) may be set as work targets. On the other hand, when seven component supply devices (3C and 3D) are work targets, a component supply device 3C and a component supply device 3D that face each are set as work targets at only one location. In this case, the multiple operators (P3, P4) must take care so that parallel work is not performed at this location, but interference between operators (P3, P4) is curtailed at other locations.

Figure 9:
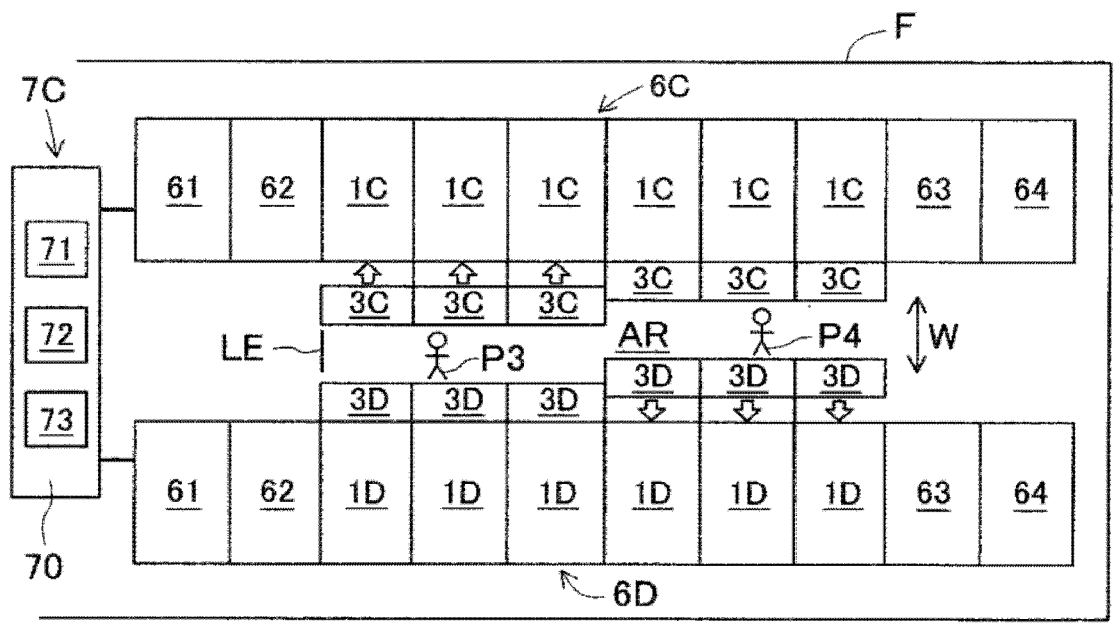
FIG. 9 shows a fourth example of arrangement positions of component supply devices that are work targets in the second embodiment.

FIG. 9 shows a fourth example of arrangement positions of component supply devices that are work targets in the second embodiment. As shown in the figure, setting section 73 sets as work targets only component supply devices 3C of the first to third first component mounters 1C from line end LE, and component supply devices 3D of the fourth to sixth second component mounters 1D from line end LE. As a result, similarly to the third example, interference between the multiple operators (P3, P4) is curtailed, and the work efficiency of changeover operation is improved.

In step S13, when the personnel quantity information indicates one operator, there is no worry that interference between operators will occur, therefore, configuration device 7 proceeds to S19 of the flowchart. Further, in S16, if width dimension W of work area AR is sufficient, there is no worry that interference between operators will occur, therefore, configuration device 7 proceeds to S19 of the flowchart. In S19, configuration device 7 sets the arrangement positions of the component supply devices (3C or 3D) that are work targets by another method without limiting the arrangement positions. Configuration device 7 may alternatively perform conventional optimization processing, but is not limited thereto.

In the second embodiment, the quantity of component supply devices (3C, 3D) to be work targets is limited, and furthermore, the arrangement positions are optimized to curtail interference between the multiple operators (P3, P4), such that changeover operation is made more efficient. Similar to the first embodiment, this effect is particular pronounced in a production type of high-mix low-volume production.

4. Changeover Operation Configuration Device 7E of a Third Embodiment

Figure 10:
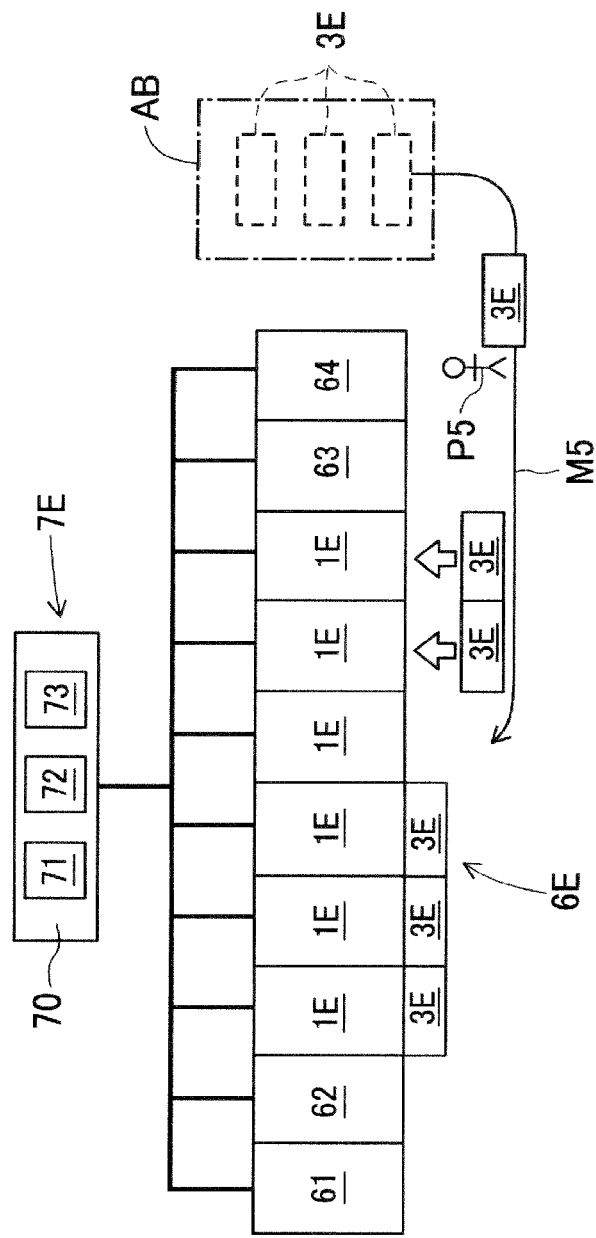
FIG. 10 is a plan view schematically showing the arrangement of a component mounting line and an external changeover work area of a third embodiment.

Changeover operation configuration device 7E of a third embodiment will be described with reference to FIG. 10, with points that are different from the first and second embodiments mainly being described. In the third embodiment, operator P5 performs external changeover operation in external changeover work area AB. FIG. 10 is a plan view schematically showing the arrangement of component mounting line 6E and external changeover work area AB of a third embodiment. Component mounting line 6E is formed by arranging six component mounters 1E in a row. The upstream side and downstream side line configurations of component mounting line 6E are the same as those of the first embodiment. External changeover work area AB is provided on a line extending from the downstream side of component mounting line 6E.

Each component mounter 1E has component supply devices 3E detachably attached at one side. Each component supply device 3E is prepared in advance in external changeover work area AB. Configuration device 7E of the third embodiment differs in functionality from the first and second embodiments. Configuration device 7E operates prior to the external changeover operation.

Registration section 71 of configuration device 7E registers the line layout information of component mounting line 6E and the work area layout information relating to the arrangement of external changeover work area AB. The line layout information and the work area layout information do not need to be re-registered if they have been registered in the past. As a result, configuration device 7E can grasp the arrangement relationship between component mounting line 6E and external changeover work area AB. Aggregation section 72, similar to with the first embodiment, selects the component types for which changeover operation is to be performed, aggregates the component types to a restricted quantity of component supply devices and designates those component supply devices as work targets.

Setting section 73 sets the arrangement positions of component supply devices 3E that are work targets adjacent to external changeover work area AB based on the arrangement relationship already grasped. As shown in the example of FIG. 10, setting section 73 sets component supply devices 3E of the three component mounters 1E on the downstream side of component mounting line 6E as work targets. As a result, compared to a case in which other settings are specified, conveyance path M5, along which the three component supply devices 3E prepared by operator P5 at external changeover work area AB are conveyed to component mounting line 6E, is made shorter. Therefore, the work efficiency of changeover operation is improved.

5. Applications and Alternative Embodiments

Note that, the changeover operation configuration device (7, 7C, and 7E) of the first to third embodiments may be separate from host computer 70. Further, the changeover operation configuration device (7, 7C, and 7E) may also be implemented as a changeover operation configuration method. Also, the component mounters (1, 1C, 1D, 1E) that configure the component mounting lines (6, 6C, 6D, 6E) may be of a quantity other than six, and the line configuration of the board work lines is not limited to that described.

Further, in the second embodiment, the upstream side and the downstream side of the two component mounting lines (6C, 6D) may be opposite to each other. Also, among the component supply devices (3A, 3B, 3C, 3D, 3E) that are work targets, the arrangement order of the arrangement positions of feeder devices 31 may be optimized by optimization processing. Further, the present disclosure can be applied to a changeover operation of a component supply device including a tray type device or a combined feeder-tray type device. Various other applications and modifications are possible for the first to third embodiments.

REFERENCE SIGNS LIST 1, 1C, 1D, 1E: component mounter;
2: board conveyance device;
3A: first component supply device;
3B: second component supply device;
3C, 3D, 3E: component supply device;
31: feeder device;
4: component transfer device;
6, 6E: component mounting line;
6C: first component mounting line;
6D: second component mounting line;
7, 7C, 7E: changeover operation configuration device;
70: host computer;
71: registration section;
72: aggregation section;
73: setting section;
AR: work area;
W: work area width dimension;
LE: line edge;
AB: changeover work area;
P1, P2, P3, P4, P5: operator;
M1, M2, M3: movement path;
M5: conveyance path

The invention claimed is:

1. A changeover operation configuration device for use in a component mounting line configured from multiple component mounters lined up in a row, the component mounters each having a component supply device configured to supply multiple component types of electronic components and being configured to mount the electronic components on a board, the changeover operation configuration device being configured to set in advance changeover work of switching the multiple component types when a board type of the board is switched, the changeover operation configuration device comprising:

a processor programmed to:
register information of at least one of line layout information related to an arrangement of the component mounting line, work area layout information related to an arrangement of a work area at which the changeover operation is to be performed, and personnel quantity information of a quantity of operators who are to perform the changeover operation, the registered information including at least the personnel quantity information;

select component types for which to perform changeover operation from the multiple component types, aggregate the selected component types to a restricted quantity of the component supply devices, and designate the restricted quantity of the component supply devices as work targets; and set arrangement positions of the component supply devices that are the work targets based on the at least one of the registered information including setting the arrangement positions of the component supply devices that are the work targets using a first method in a case in which the personnel quantity information indicates one operator and using a second method different from the first method in a case in which the personnel quantity information indicates multiple operators.

2. The changeover operation configuration device according to claim 1, wherein the processor is programmed to, in the case in which the personnel quantity information indicates the one operator, set the arrangement positions of the component supply devices that are the work targets such that a length of a movement path along which the one operator moves during the changeover operation is made short.

3. The changeover operation configuration device according to claim 2, wherein
the component mounters each include the component supply device at one side in a line width direction of the component mounting line and another side in the line width direction of the component mounting line, and
the processor is programmed to, in the case in which the personnel quantity information indicates the one operator, set the arrangement positions of the component supply devices that are the work targets such that the multiple component supply devices are collected on the one side, or such that the multiple component supply devices are collected at the one side and the other side of the component mounter that is at an upstream side or a downstream side of the component mounting line.

4. The changeover operation configuration device according to claim 3, wherein the processor is programmed to, in the case in which the personnel quantity information indicates the multiple operators, set the arrangement positions of the component supply devices that are the work targets without restriction.

5. The changeover operation configuration device according to claim 1, wherein the processor is programmed to, in the case in which the personnel quantity information indicates the multiple operators, set the arrangement positions of the component supply devices that are the work targets such that interference between the multiple operators during changeover operation is curtailed.

6. The changeover operation configuration device according to claim 5, wherein
a first component mounting line and a second component mounting line are arranged lined up, multiple first component mounters that compose the first component mounting line and multiple second component mounters that compose the second component mounting line each include the component supply devices on sides that face each other, and the work area is demarcated between the first component mounting line and the second component mounting line, and
the processor is programmed to:
register a width dimension of the work area that defines a separation distance between the first component mounting line and the second component mounting line as the work area layout information, and
in a case in which the width dimension of the work area is small such that there is a worry of interference between the multiple operators, set only the component supply device of one out of the first component mounters and the second component mounters that face each other as the work target.

7. The changeover operation configuration device according to claim 6, wherein the processor is programmed to set as the work targets only the component supply devices of the first component mounters with an odd number when counting from a shared line end of the first component mounting line and the second component mounting line and the component supply devices of the second component mounters with an even number when counting from the shared line end of the first component mounting line and the second component mounting line.

8. The changeover operation configuration device according to claim 6, wherein the processor is programmed to set as the work targets only the component supply devices of the first component mounters that are close to a shared line end of the first component mounting line and the second component mounting line and the component supply devices of the second component mounters that are far from the shared line end of the first component mounting line and the second component mounting line.

9. The changeover operation configuration device according to claim 6, wherein the processor is programmed to, in a case in which the width dimension of the work area is large such that there is no worry about interference between the multiple operators, set the arrangement positions of the component supply devices that are the work targets without restriction.

10. The changeover operation configuration device according to claim 1, wherein
the component mounters are configured to allow a component supply device for which changeover has been performed in advance in an external changeover work area to be attached, and
the processor is programmed to:
register line layout information and work area layout information related to an arrangement position of the external changeover work area, and
set the arrangement positions of the component supply devices that are the work targets to be adjacent to the external changeover work area.

11. A changeover operation configuration method for use in a component mounting line configured from multiple component mounters lined up in a row, the component mounters each having a component supply device configured to supply multiple component types of electronic components and being configured to mount the electronic components on a board, the changeover operation configuration method being configured to set in advance changeover work of switching the multiple component types when a board type of the board is switched, the changeover operation configuration method comprising:
registering information of at least one of line layout information related to an arrangement of the component mounting line, work area layout information related to an arrangement of a work area at which the changeover operation is to be performed, and personnel quantity information of a quantity of operators who are to perform the changeover operation, the registered information including at least the personnel quantity information;
selecting component types for which to perform changeover operation from the multiple component types, aggregating the selected component types to a restricted quantity of the component supply devices, and designating the restricted quantity of the component supply devices as work targets; and
setting arrangement positions of the component supply devices that are the work targets based on the at least one of the registered information including setting the arrangement positions of the component supply devices that are the work targets using a first method in a case in which the personnel quantity information indicates one operator and using a second method different from the first method in a case in which the personnel quantity information indicates multiple operators.

12. The changeover operation configuration method according to claim 11, further comprising setting the arrangement positions of the component supply devices that are the work targets such that a length of a movement path along which the one operator moves during the changeover operation is made short in the case in which the personnel quantity information indicates the one operator.

13. The changeover operation configuration method according to claim 12, wherein
the component mounters each include the component supply device at one side in a line width direction of the component mounting line and another side in the line width direction of the component mounting line, and
the method further comprises setting the arrangement positions of the component supply devices that are the work targets such that the multiple component supply devices are collected on the one side, or such that the multiple component supply devices are collected at the one side and the other side of the component mounter that is at an upstream side or a downstream side of the component mounting line in the case in which the personnel quantity information indicates the one operator.

14. The changeover operation configuration method according to claim 13, further comprising setting the arrangement positions of the component supply devices that are the work targets without restriction in the case in which the personnel quantity information indicates the multiple operators.

15. The changeover operation configuration method according to claim 11, further comprising setting the arrangement positions of the component supply devices that are the work targets such that interference between the multiple operators during changeover operation is curtailed in the case in which the personnel quantity information indicates the multiple operators.

16. The changeover operation configuration method according to claim 15, wherein
a first component mounting line and a second component mounting line are arranged lined up, multiple first component mounters that compose the first component mounting line and multiple second component mounters that compose the second component mounting line each include the component supply devices on sides that face each other, and the work area is demarcated between the first component mounting line and the second component mounting line, and
the method further comprises:
registering a width dimension of the work area that defines a separation distance between the first component mounting line and the second component mounting line as the work area layout information, and
setting only the component supply device of one out of the first component mounters and the second component mounters that face each other as the work target in a case in which the width dimension of the work area is small such that there is a worry of interference between the multiple operators.

17. The changeover operation configuration method according to claim 16, further comprising setting as the work targets only the component supply devices of the first component mounters with an odd number when counting from a shared line end of the first component mounting line and the second component mounting line and the component supply devices of the second component mounters with an even number when counting from the shared line end of the first component mounting line and the second component mounting line.

18. The changeover operation configuration method according to claim 16, further comprising setting as the work targets only the component supply devices of the first component mounters that are close to a shared line end of the first component mounting line and the second component mounting line and the component supply devices of the second component mounters that are far from the shared line end of the first component mounting line and the second component mounting line.

19. The changeover operation configuration method according to claim 16, further comprising setting the arrangement positions of the component supply devices that are the work targets without restriction in a case in which the width dimension of the work area is large such that there is no worry about interference between the multiple operators.

20. The changeover operation configuration method according to claim 11, wherein
the component mounters are configured to allow the component supply device for which changeover has been performed in advance in an external changeover work area to be attached, and
the method further comprises:
registering line layout information and work area layout information related to an arrangement position of the external changeover work area, and
setting the arrangement positions of the component supply devices that are the work targets to be adjacent to the external changeover work area.

* * * * *